(12) United States Patent
Asada et al.

(10) Patent No.: US 11,011,383 B2
(45) Date of Patent: May 18, 2021

(54) ETCHING METHOD (71) Applicant: TOKYO ELECTRON LIMITED, Tokyo (JP)

(72) Inventors: Yasuo Asada, Nirasaki (JP); Takehiko Orii, Nirasaki (JP); Nobuhiro Takahashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/252,918

(22) Filed: Jan. 21, 2019

(65) Prior Publication Data
US 2019/0228981 A1 Jul. 25, 2019

(30) Foreign Application Priority Data

Jan. 22, 2018 (JP) .............................. JP2018-007909
Nov. 29, 2018 (JP) .............................. JP2018-224206

(51) Int. Cl.
*H01L 21/3065* (2006.01)
*H01L 21/28* (2006.01)

(52) U.S. Cl.
CPC .......... *H01L 21/3065* (2013.01); *H01L 21/28* (2013.01)

(58) Field of Classification Search
CPC ................ H01L 21/3065; H01L 21/28; H01L 21/67109; H01L 21/6719
See application file for complete search history.

(56) References Cited

U.S. PATENT DOCUMENTS

2006/0270239 A1* 11/2006 Triyoso .................. H01L 21/265
438/706
2016/0225637 A1* 8/2016 Takahashi ........... H01L 21/3065

FOREIGN PATENT DOCUMENTS

| JP | 200377888 A | 3/2003 |
| JP | 2009510750 A | 3/2009 |
| JP | 2013225604 A | 10/2013 |
| JP | 2016143781 A | 8/2016 |
| JP | 6138653 B2 | 5/2017 |
| KR | 10-2016-0095617 A | 8/2016 |
| KR | 10-2017-0069248 A | 6/2017 |

OTHER PUBLICATIONS

Oehrlein et al. (Interactive effects in the reactive ion etching of SiGe alloys. Appl. Phys. Lett. 58, 2252 (1991)) (Year: 1991).*

* cited by examiner

*Primary Examiner* — Duy Vu N Deo
*Assistant Examiner* — Mahmoud Dahimene
(74) *Attorney, Agent, or Firm* — Nath, Goldberg & Meyer; Jerald L. Meyer (57) ABSTRACT

There is provided an etching method which includes: supplying an etching gas to a workpiece including a first SiGe-based material and a second SiGe-based material having different Ge concentrations; and selectively etching the first SiGe-based material and the second SiGe-based material with respect to the other using a difference in incubation time until the first SiGe-based material and the second SiGe-based material begin to be etched by the etching gas.

12 Claims, 9 Drawing Sheets

ETCHING METHOD

CROSS-REFERENCE TO RELATED APPLICATIONS

This application is based upon and claims the benefit of priority from Japanese Patent Application No. 2018-007909, filed on Jan. 22, 2018 and Japanese Patent Application No. 2018-224206 filed on Nov. 29, 2018, respectively, the entire contents of which are incorporated herein by reference.

TECHNICAL FIELD

The present disclosure relates to an etching method for etching a SiGe-based material.

BACKGROUND

In recent years, silicon germanium (hereinafter referred to as SiGe) is known as a new semiconductor material besides silicon (hereinafter referred to as Si). As a semiconductor device using SiGe, there is a semiconductor device obtained by stacking a Si layer and a SiGe layer and then selectively etching the SiGe layer with respect to the Si layer, or a semiconductor device obtained by stacking a Si layer and a SiGe layer and then selectively etching the Si layer with respect to the SiGe layer.

As techniques for selectively etching SiGe with respect to Si, there are known a technique using $ClF_3$ or $XeF_2$ as an etching gas, a technique using HF, and a technique using plasma of a mixed gas of an $NF_3$ gas and an $O_2$ gas. Furthermore, as a technique for selectively etching Si with respect to SiGe, there is known a technique of performing etching by adding a gas containing germanium to an etching gas containing $SF_6$ or $CF_4$.

In addition, there is known a technique of selectively etching SiGe with respect to Si or Si with respect to SiGe by changing a ratio of a $F_2$ gas and an $NH_3$ gas.

In all of the aforementioned techniques, SiGe is merely selectively etched with respect to Si, or Si is merely selectively etched with respect to SiGe. However, in recent years, it is also required that one of SiGe-based materials differing in Ge concentration from each other is etched at a high selectivity with respect to the other. The aforementioned conventional techniques cannot satisfy such new requirements.

SUMMARY

Some embodiments of the present disclosure provide an etching method capable of etching one of SiGe-based materials differing in Ge concentration from each other at a high selectivity with respect to the other.

According to one embodiment of the present disclosure, there is provided an etching method which includes: supplying an etching gas to a workpiece including a first SiGe-based material and a second SiGe-based material having different Ge concentrations; and selectively etching the first SiGe-based material and the second SiGe-based material with respect to the other using a difference in incubation time until the first SiGe-based material and the second SiGe-based material begin to be etched by the etching gas.

According to another embodiment of the present disclosure, there is provided an etching method which includes: repeating, a multiple number of times, an etching process of supplying an etching gas to a workpiece including a first SiGe-based material and a second SiGe-based material having different Ge concentrations for an etching time during which one of the first SiGe-based material and the second SiGe-based material is etched and the other is hardly etched, and a purging process of purging a process space; and selectively etching the first SiGe-based material and the second SiGe-based material with respect to the other.

According to another embodiment of the present disclosure, there is provided an etching method which includes: supplying an etching gas in a low temperature range to a workpiece including a first SiGe-based material and a second SiGe-based material having different Ge concentrations; and selectively etching one of the first SiGe-based material and the second SiGe-based material with respect to the other.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

First, a first embodiment will be described.

In the present embodiment, an etching gas, for example a gas including a fluorine-containing gas, is supplied to a target substrate including a first SiGe-based material and a second SiGe-based material having different Ge concentrations. At a temperature at which a difference in incubation time occurs up until the etching of the first SiGe-based material and the second SiGe-based material, one of the first SiGe-based material and the second SiGe-based material is selectively etched with respect to the other using the difference in incubation time. In the present embodiment, the SiGe-based material also includes a case where Ge is 0% (i.e., a case where the SiGe-based material is Si).

In a first example of the present embodiment, a workpiece is prepared that includes a first film composed of SiGe having a relatively high Ge concentration as the first SiGe-based material, and a second film composed of a SiGe film having a relatively low Ge concentration or an Si film containing 0% of Ge as the second SiGe-based material. A fluorine-containing gas as an etching gas is supplied to the workpiece to selectively etch the first film with respect to the second film. Besides the fluorine-containing gas, an inert gas such as Ar or the like may be supplied. At this time, the etching selectivity of the first film with respect to the second film in a state where the second film is relatively unetched may be 5 or more.

As the fluorine-containing gas, a $ClF_3$ gas, a $F_2$ gas, an $IF_7$ gas or the like may be used.

At this time, if the fluorine-containing gas as described above is used as the etching gas, the first film having a higher Ge concentration is more easily etched than the second film having a lower Ge concentration. Therefore, due to such a difference in chemical reactivity, the first film can be selectively etched with respect to the second film. However, when etching is performed using only the difference in chemical reactivity to the etching gas, in particular, in a high temperature range, the second film can also be etched. This is not desirable.

Figure 1:
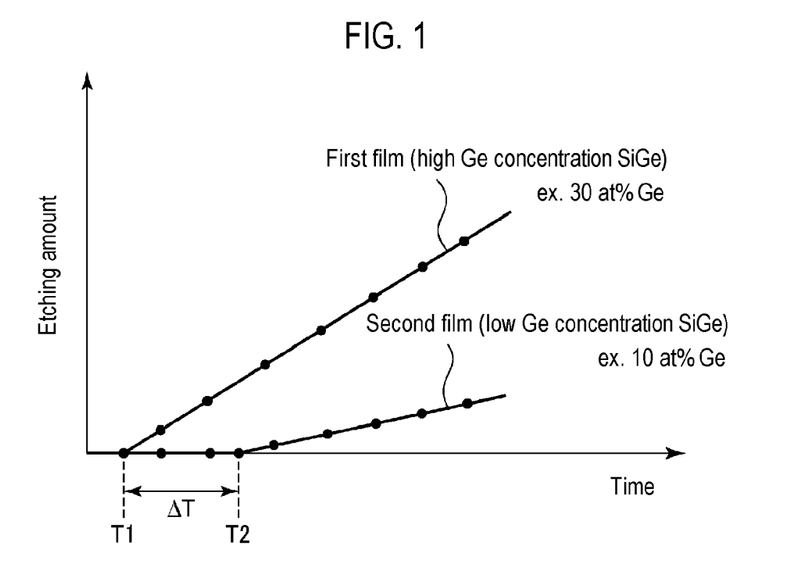
FIG. 1 is a diagram for schematically explaining an etching method according to a first example of a first embodiment.

On the other hand, in this example, selective etching is performed by utilizing the difference in incubation time of the etching reactions of the first film and the second film in a predetermined temperature range, specifically in the high temperature range described below. The incubation time refers to a period of time until an etching reaction begins after supplying an etching gas. As shown in FIG. 1, the incubation time (T2) of the second film having a low Ge concentration is longer than the incubation time T1 of the first film having a high Ge concentration. By utilizing the incubation time difference ΔT between the incubation times T1 and T2, the first film is etched while sufficiently suppressing the etching of the second film. Thus, the etching is performed at a high selectivity.

It is considered that such incubation time difference (ΔT) exists because an $SiO_2$ film, which is a natural oxide film and cannot be etched by a fluorine-containing gas, is formed on the surface of the second film than on the first film.

The incubation time can be adjusted by a temperature (etching temperature) of the workpiece at the time of etching. The etching temperature may be set so that a sufficient level of incubation time difference (ΔT) exists between the first film and the second film. At this time, the time required for etching the first film may be equal to or less than the incubation time (T2), i.e., an incubation period, of the second film. As a result, the first film can be etched at a high selectivity with respect to the second film without substantially etching the second film.

In this example, as described above, a Si film containing 0% of Ge can also be used as the second film having a low Ge concentration. Incidentally, it is more effective when both the first film and the second film are SiGe films. The Ge concentration of the first film having a high Ge concentration may fall within a range of 20 to 50 at %, specifically in a range of 25 to 35 at %, for example, 30 at %. Furthermore, the Ge concentration of the second film may fall within a range of 0 to 20 at % (not including 20 at %), specifically in a range of 5 to 15 at %, for example, 10 at %.

In the present embodiment, the etching temperature may be at a high temperature range of 100 degrees C. or more, specifically 100 to 125 degrees C., or more specifically 120 degrees C. When the SiGe film is etched with a fluorine-containing gas, such as $ClF_3$ gas, the lower the temperature the easier it is for the SiGe film to be etched. The natural oxide film is also etched with ease. Depending on the film quality of SiGe, near 80 degrees C., the natural oxide film on the surface of the SiGe film having a low Ge concentration is easily etched. This shortens the incubation time, which makes it difficult to obtain the incubation time difference. On the other hand, in the high temperature range of 100 degrees C. or higher, the etching rate of the natural oxide film on the surface of the SiGe film and the etching rate of the SiGe film itself are lowered. In the SiGe film having a low Ge concentration, the natural oxide film is also hardly etched. Thus, it is possible to lengthen the incubation time of the second film having a low Ge concentration and to lengthen the incubation time difference. In particular, at around 120 degrees C., the incubation time of the SiGe film containing 10 at % of Ge can be made sufficiently long enough to reach about 10 min. For example, up to 10 minutes of etching time, the first film having a high Ge concentration of 30 at % can be etched at a high selectivity without substantially etching the second film having a low Ge concentration. However, if the etching temperature reaches 130 degrees C. or higher, the first film having a high Ge concentration becomes difficult to etch.

A pressure during the etching may fall within a range of 10 to 1,000 mTorr (1.33 to 133 Pa), for example, 120 mTorr (16 Pa).

Next, the experiment results of the first example of the first embodiment will be described.

Figure 2:
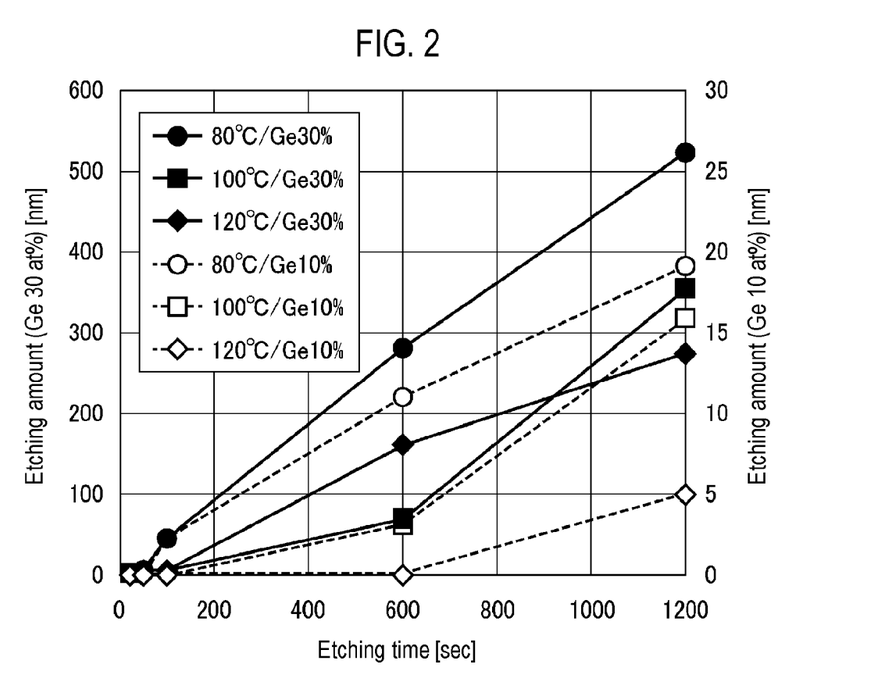
FIG. 2 is a diagram showing a relationship between an etching time and an etching amount of a Si-10% Ge film and a Si-30% Ge film at 80 degrees C., 100 degrees C. and 120 degrees C.
Figure 3:
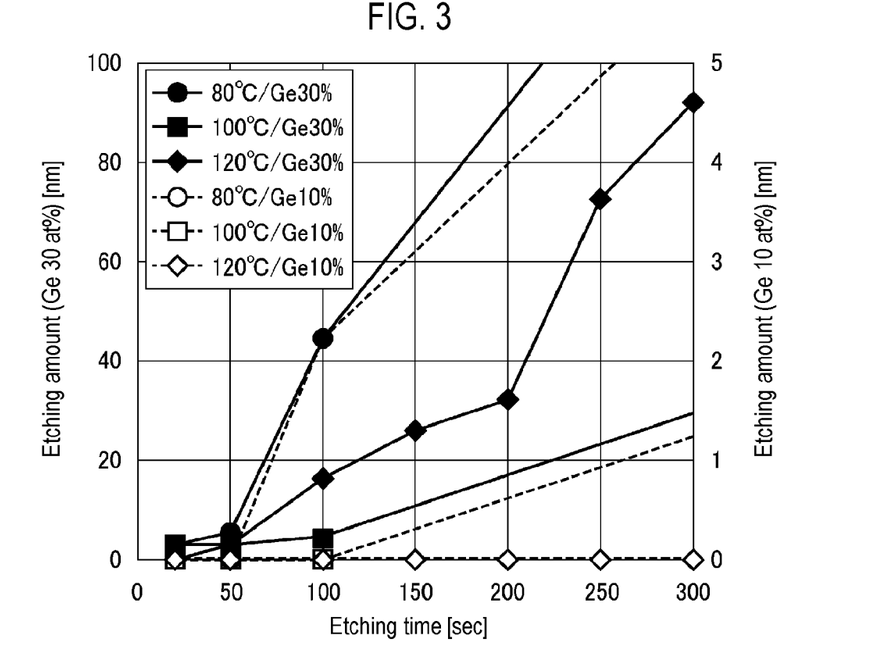
FIG. 3 is an enlarged view of a portion of FIG. 2.

In this embodiment, a $ClF_3$ gas was used as an etching gas. For a SiGe film (Si-10% Ge film) having a Ge concentration of 10 at % and a SiGe film (Si-30% Ge film) having a Ge concentration of 30 at %, a relationship between an etching time and an etching amount was obtained while adjusting the etching temperature to 80 degrees C., 100 degrees C., and 120 degrees C. The results are shown in FIG. 2. FIG. 3 is an enlarged view of a portion of FIG. 2.

As shown in FIGS. 2 and 3, both the Si-10% Ge film and the Si-30% Ge film were etched in a greater amount at 80 degrees C. At any temperature, the Si-30% Ge film was etched in a greater amount than the Si-10% Ge film. Furthermore, at 80 degrees C., the incubation times of both the Si-10% Ge film and the Si-30% Ge film were short. The etching of the Si-10% Ge film started within a short period of time. The etching amount of the Si-10% Ge film reached 10 nm or more in 600 seconds (10 min). In contrast, when the etching temperature was 100 degrees C., the incubation time of the Si-10% Ge film was 100 seconds. Thus, it can be concluded that etching occurs using the difference in incubation time between the Si-10% Ge film and the Si-30% Ge film. Even when the etching time is 600 seconds (10 min), the etching amount of the Si-10% Ge film was about 3 nm. Thus, it is shown that the Si-30% Ge film is etched while suppressing the etching of the Si-10% Ge film. At an etching temperature of 120 degrees C., the incubation time of the Si-0% Ge film was 600 seconds (10 min). It was confirmed that the Si-30% Ge film can be etched at an infinite selectivity with respect to the Si-10% Ge film for a long period of time of 600 seconds. In addition, at the etching temperature of 120 degrees C., the etching amount of the Si-10% Ge film was as small as about 5 nm even when the etching time was 1200 seconds.

Next, a second example of the present embodiment will be described. In the second example, a workpiece is prepared that includes a first film made of SiGe having a relatively high Ge concentration as a first SiGe-based material, and a second film composed of a SiGe film having a relatively low Ge concentration or a Si film containing 0% of Ge as a second SiGe-based material are prepared. A fluorine-containing gas and $NH_3$ gas are supplied as etching gases to the workpiece to selectively etch the second film with respect to the first film. That is to say, contrary to the first example, the second film having a low Ge concentration is selectively etched with respect to the first film having a high Ge concentration. Here, the etching selectivity of the second film with respect to the first film in the state where the first film is hardly etched may be 5 or more.

By adding the $NH_3$ gas as the etching gas in this manner, the difference in the Ge concentration is inverted because the $SiO_2$ film as a natural oxide film on the surface is easily etched due to the addition of the $NH_3$ gas to the fluorine-containing gas. $ClF_3$ gas, a $F_2$ gas, an $IF_7$ gas or the like may be substituted as the fluorine-containing gas. A ratio of the fluorine-containing gas to the $NH_3$ gas may fall within a range of 1/500 to 1.

Also in this example, the Ge concentrations in the first film and the second film are the same as in the first example, and only the film to be etched is different. The etching temperature is also the same. The etching temperature may be 100 degrees C. or more, specifically 100 to 125 degrees C., more specifically 120 degrees C.

Second Embodiment

Next, a second embodiment will be described.

In the present embodiment, a process of supplying an etching gas, for example, a gas including a fluorine-containing gas to a target substrate including a first SiGe-based material and a second SiGe-based material having different Ge concentrations and performing an etching process on the target substrate for an etching time during which one of the first SiGe-based material and the second SiGe-based material is etched and the other is not substantially etched, and a process of purging a process space, are repeated a plurality of times. Thus, one of the first SiGe-based material and the second SiGe-based material is selectively etched with respect to the other. Also in the present embodiment, the SiGe-based material includes a case where Ge is 0% (i.e., a case where the SiGe-based material is Si).

Figure 4:
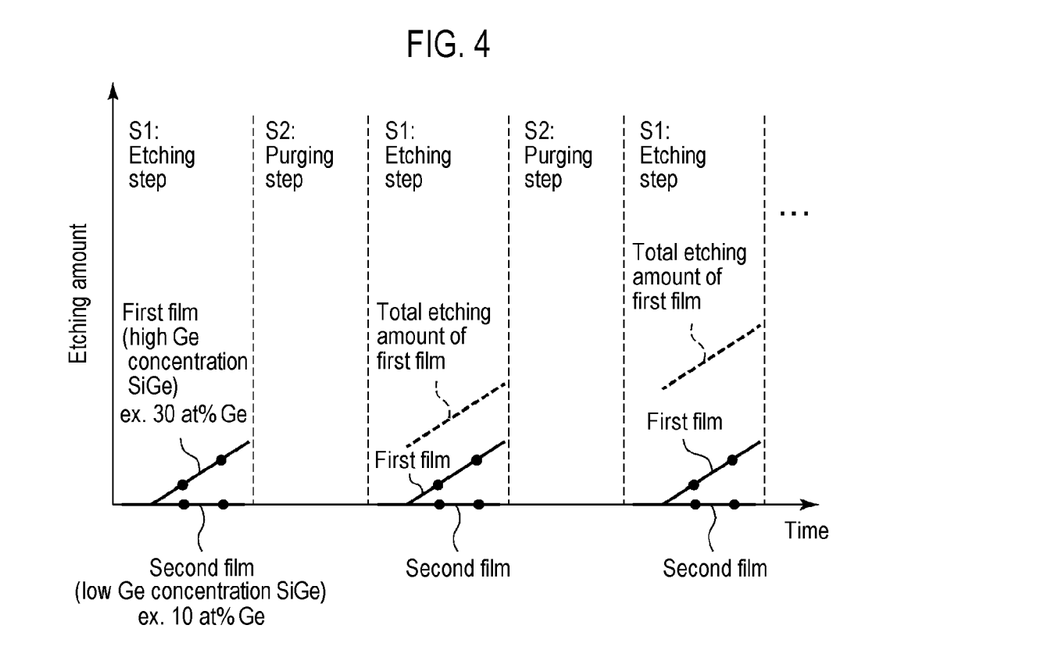
FIG. 4 is a diagram for schematically explaining an etching method according to a first example of a second embodiment.

In a first example of the present embodiment, a workpiece is prepared that includes a first film made of SiGe having a relatively high Ge concentration as a first SiGe-based material, and a second film composed of a SiGe film having a relatively low Ge concentration or a Si film containing 0% of Ge as a second SiGe-based material. As shown in FIG. 4, an etching step (S1) of supplying a fluorine-containing gas as an etching gas to the workpiece for an etching time during which the first SiGe-based material is etched and the second SiGe-based material is not substantially etched, and a purging step (S2) of purging the process space, are repeated for a predetermined number of times. The purging step (S2) of purging the process space may be performed by evacuating a process container that defines the process space. An inert gas as a purge gas may be supplied to the process space together with the evacuation. By repeating the etching step (S1) and the purging step (S2) for a predetermined number, it is possible to etch the first film at a high selectivity with respect to the second film without substantially etching the second film. At this time, the etching selectivity of the first film to the second film in the state where the second film is hardly etched may be 5 or more.

In an embodiment, it is preferable that the first round of etching step (S1) be completed during a period in which the second film is incubated and the first film is etched. As a result, even if the etching step (S1) is repeated, it is possible to obtain a desired etching amount by repeatedly etching only the first film without substantially etching the natural oxide film on the surface of the second film. Accordingly, even if the incubation time difference between the first film and the second film is small, only the first film can be substantially etched by a desired amount. Thus, a margin of the etching temperature is wider than that in the first embodiment.

In another embodiment, as the fluorine-containing gas, a $ClF_3$ gas, a $F_2$ gas, an $IF_7$ gas or the like may be used as in the first embodiment. In addition to the fluorine-containing gas, an inert gas such as an Ar gas or the like may be supplied.

As described above, a Si film containing 0% of Ge is also permitted as the second film having a relatively low Ge concentration. It is more effective when both the first film and the second film are SiGe films. As a concrete numerical value, the Ge concentration of the first film having a relatively high Ge concentration may fall within a range of 20 to 50 at %, specifically a range of 25 to 35 at %, for example, 30 at %. Furthermore, the Ge concentration of the second film may fall within a range of 0 to 20 at % (not including 20 at %), specifically a range of 5 to 15 at %, for example, 10 at %.

As described above, the margin for the etching temperature is wider than that in the first embodiment. Also in this example, the etching temperature may be 100 degrees C. or higher, specifically 100 to 125 degrees C., more specifically 120 degrees C.

In this example, time for the first-round etching step (S1) may be 1 to 10 seconds, and the time of the first-round purging step (S2) may be 5 to 30 seconds. Furthermore, pressure during the etching may fall within a range of 10 to 1,000 mTorr (1.33 to 133 Pa), for example, 120 mTorr (16 Pa).

Next, a second example of the present embodiment will be described. In the second example, a workpiece was prepared that includes a first film made of SiGe having a relatively high Ge concentration as a first SiGe-based material, and a second film composed of a SiGe film having a relatively low Ge concentration or a Si film containing 0% of Ge as a second SiGe-based material. An etching step of supplying a fluorine-containing gas and an $NH_3$ gas as etching gases to the workpiece and performing an etching process on the workpiece for an etching time during which the second SiGe-based material is etched and the first SiGe-based material is not substantially etched, and a purging step of purging a process space, was repeated a predetermined number of times. That is to say, contrary to the first example, the second film having a relatively low Ge concentration is selectively etched with respect to the first film having a relatively high Ge concentration. At this time, the etching selectivity of the second film to the first film in the state where the first film is hardly etched may be 5 or more.

In one embodiment, by adding the $NH_3$ gas as the etching gas, the difference in Ge concentration is inverted by the same principle as in the second example of the first embodiment.

Third Embodiment

Next, a third embodiment will be described.

In the present embodiment, an etching gas, for example, a gas including a fluorine-containing gas is supplied in a low temperature range to a target substrate including a first SiGe-based material and a second SiGe-based material having different Ge concentrations to selectively etch one of the first SiGe-based material and the second SiGe-based material with respect to the other. In the present embodiment, unlike the first embodiment utilizing the incubation time difference, the selectivity is secured by a difference in etching amount between the first SiGe-based material and the second SiGe-based material. Furthermore, in the present embodiment, the SiGe-based material also includes a case where Ge is 0% (i.e., a case where the SiGe-based material is Si).

In a first example of the present embodiment, a workpiece is prepared that includes a first film composed of SiGe having a relatively high Ge concentration as a first SiGe-based material, and a second film composed of a SiGe film having a relatively low Ge concentration or a Si film containing 0% of Ge as a second SiGe-based material. A fluorine-containing gas as an etching gas is supplied to the workpiece to selectively etch the first film with respect to the second film. Besides the fluorine-containing gas, an inert gas such as an Ar gas or the like may be supplied. The etching selectivity of the first film with respect to the second film in the state where the second film is hardly etched may be 5 or more.

As the fluorine-containing gas, a $ClF_3$ gas, a $F_2$ gas, an $IF_7$ gas or the like may be used.

At this time, if the fluorine-containing gas as described above is used as the etching gas, the first film having a relatively high Ge concentration is more easily etched than the second film having a relatively low Ge concentration.

Therefore, due to such a difference in chemical reactivity, the first film can be selectively etched with respect to the second film.

Pressure during the etching may fall within a range of 10 to 1,000 mTorr (1.33 to 133 Pa). For example, the pressure may be 120 mTorr (16 Pa).

In the present embodiment, the etching temperature is in a low temperature range and may be 60 degrees C. or less, specifically in a range of 0 to 60 degrees C.

The reason for the lower temperature will be described below with reference to FIGS. 5 and 6 which actually show a relationship between the etching temperature and the etching amount.

Figure 5:
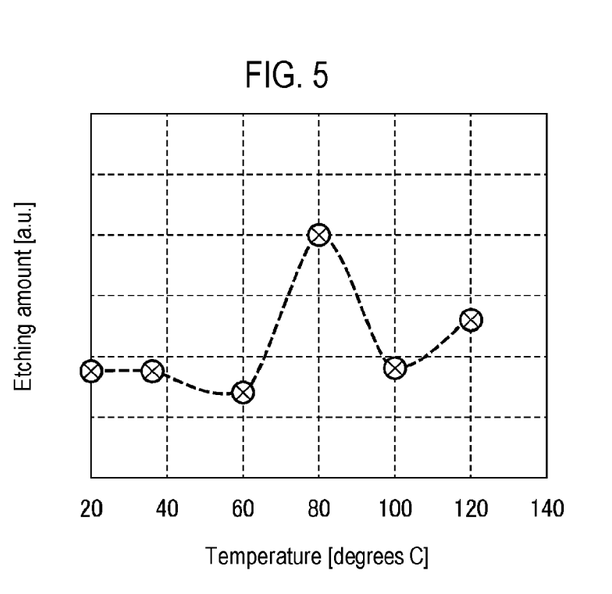
FIG. 5 is a diagram showing a dependence of etching amount on temperature when a Si film having a Ge concentration of 0% is etched with a $ClF_3$ gas.

FIG. 5 is a graph showing a dependence of the etching amount on temperature when a Si film having a Ge concentration of 0% is etched with a $ClF_3$ gas which is a fluorine-containing gas. FIG. 5 shows the tendency of the etching amount when etching is performed in a state where the etching time is set to 30 sec at each temperature of 20 to 120 degrees C. Etching conditions for the Si film are as follows. A flow rate of $ClF_3$ gas is 20 to 500 sccm, a flow rate of Ar gas is 100 to 1,000 sccm, and the pressure is 500 to 3,000 mTorr. As shown in FIG. 5, the etching amount for the Si film is in a non-linear relationship with temperature. The etching amount tends to increase in the middle temperature range of around 80 degrees C., and tends to decrease at 60 degrees C. or less and at 100 degrees C. or more. In particular, at 60 degrees C. or less, the etching amount of the Si film is further reduced. This tendency is presumably because the etching of the Si film using the $ClF_3$ gas is influenced by the chemical adsorption characteristics. This tendency is considered to be similar even for a SiGe film (e.g., Si-10% Ge film) having a small Ge amount.

Figure 6:
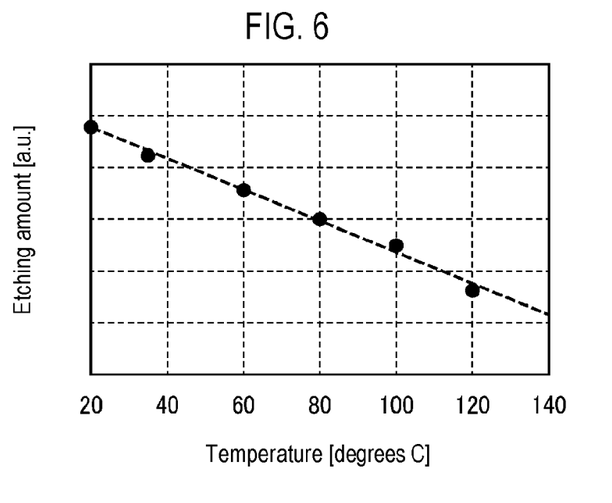
FIG. 6 is a graph showing a dependence of etching amount on temperature when a SiGe film (Si-30% Ge film) having a Ge concentration of 30 at % is etched with a $ClF_3$ gas.

On the other hand, FIG. 6 is a diagram showing a dependence of etching amount on temperature when a SiGe film (Si-30% Ge film) having a Ge concentration of 30 at % is etched with a $ClF_3$ gas. FIG. 6 shows etching amounts when etching is performed in a state where the etching time is set to 30 sec at each temperature of 20 to 120 degrees C. Etching conditions of the Si-30% Ge film are as follows. A flow rate of the $ClF_3$ gas is 1 to 100 sccm, a flow rate of the Ar gas is 100 to 1,000 sccm, and the pressure is 10 to 1,000 mTorr. From FIG. 6, it can be noted that the physical adsorption characteristic seems to be strong in the etching of the Si-30% Ge film, the etching amount is in a linear relationship with temperature, and the etching amount tends to increase as the temperature becomes lower.

Figure 7:
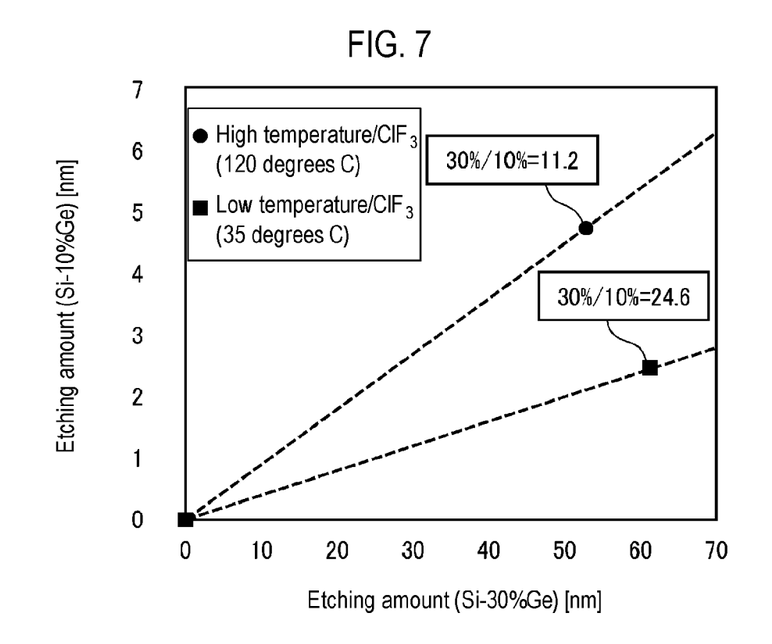
FIG. 7 is a graph showing an etching selectivity of a Si-30% Ge film with respect to a Si-10% Ge film when the Si-10% Ge film and the Si-30% Ge film are etched at 35 degrees C. which falls within a low temperature range and at 120 degrees C. which falls within a high temperature range.

From FIGS. 5 and 6, it can be seen that in the low temperature range of 60 degrees C. or less where the etching amount of the Si-30% Ge film is increased and the etching amount of the Si film is reduced, the etching selectivity of the Si-30% Ge film relative to the Si film can be made higher than in the higher temperature range, and the value of the etching selectivity tends to increase as the temperature becomes lower. As shown in FIG. 7, the etching selectivity of the Si-30% Ge film relative to the Si-10% Ge film which shows the etching tendency similar to that of the Si film has a value of 20 or more. In FIGS. 5 and 6, there is only data to 20 degrees C. Extrapolating from these figures, a higher selectivity can be obtained at least up to 0 degrees C. In the low temperature range of 60 degrees C. or less, specifically 0 to 60 degrees C., more specifically 20 to 60 degrees C., the first film made of SiGe having a relatively high Ge concentration can be etched at a very high selectivity with respect to the second film made of SiGe having a relatively low Ge concentration (including 0% of Ge) without utilizing the incubation time difference.

As the temperature increases, the etching amount of the Si-30% Ge film decreases. This adversely affects the etching selectivity of the Si-30% Ge film to the Si film. However, at temperature greater than 100 degrees C., the etching amount of the Si film becomes smaller than at around 80 degrees C. Therefore, even in the temperature range of 100 degrees C. or higher, the etching selectivity of the Si-30% Ge film to the Si film can be increased without utilizing the incubation time difference. However, as described in the first embodiment, by utilizing the incubation time difference in the high temperature range, it is possible to etch the first film at a higher selectivity with respect to the second film.

Next, the experiment results of the first example of the third embodiment will be described.

First, using a $ClF_3$ gas as an etching gas, a SiGe film (Si-10% Ge film) having a Ge concentration of 10 at % and a SiGe film (Si-30% Ge film) having a Ge concentration of 30 at % were etched at 35 degrees C. which is a low temperature range and at 120 degrees C. which is a high temperature range. FIG. 7 plots both the etching performed at 35 degrees C. and the etching performed at 120 degrees C., wherein the etching amount of the Si-30% Ge film is indicated on the X-axis and the etching amount of the Si-10% Ge film is indicated on the Y-axis. Etching conditions applied are as follows: a flow rate of $ClF_3$ is 1 to 100 sccm, a flow rate of the Ar gas is 100 to 1,000 sccm, and the pressure is 10 to 1,000 mTorr. As shown in FIG. 7, the etching selectivity of the Si-30% Ge film to the Si-10% Ge film was 24.6 at 35 degrees C. and 11.2 at 120 degrees C. From this result, it is shown that a high etching selectivity of 20 or more can be obtained in the low temperature range, and an etching selectivity of 10 or more which is not as high as in the low temperature range can be obtained even in the high temperature range.

<Structure Example of a Workpiece to which the First and Second Embodiments are Applied>

Next, a structure example of a workpiece to which the first and second embodiments are applied will be described. The workpiece is typically a semiconductor wafer (hereinafter simply referred to as "wafer").

Figure 8A:
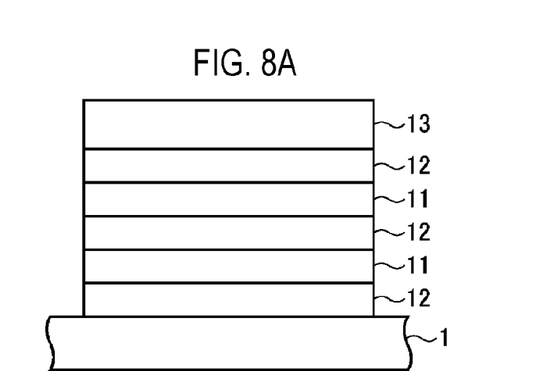
FIG. 8A is a schematic sectional view showing a first example of a structure of a workpiece to which the first and second embodiments are applied, wherein a state before etching is shown.
Figure 8B:
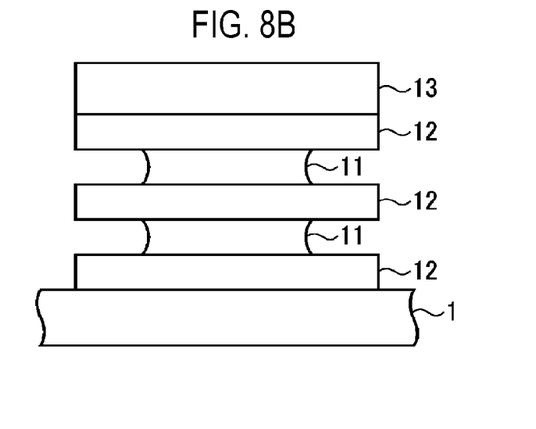
FIG. 8B is a schematic sectional view showing a first example of a structure of a workpiece to which the first and second embodiments are applied, wherein a state after etching is shown.

FIGS. 8A and 8B are diagrams showing a first example of the structure of the workpiece.

In this example, as shown in FIG. 8A, on a semiconductor substrate 1 such as a Si substrate or the like, there is formed a stacked structure of the SiGe film 11 having a relatively high Ge concentration (e.g., a Ge concentration of 30 at %) as a first film to be etched and the SiGe film 12 having a relatively low Ge concentration (e.g., a Ge concentration of 10 at %) as a second film. Specifically, the SiGe film 12 having a relatively low Ge concentration and the SiGe film 11 having a relatively high Ge concentration are sequentially stacked on the semiconductor substrate 1. The uppermost layer is the SiGe film 12 having a relatively low Ge concentration. An etching mask 13 composed of a $SiO_2$ film is formed on the uppermost SiGe film 12. The number of stacked layers of the SiGe film 12 having a relatively low Ge concentration and the SiGe film 11 having a relatively high Ge concentration may be one or more.

In this state, the workpiece is kept at a predetermined temperature. A fluorine-containing gas such as $ClF_3$ gas or the like is supplied as in the first example of the first embodiment, or the supply of the fluorine-containing gas and the purging are repeated as in the first example of the second embodiment, whereby the SiGe film 11 having a relatively high Ge concentration is etched to obtain, for example, the state of FIG. 8B. At this time, the SiGe film 12 having a relatively low Ge concentration is hardly etched. In FIG. 8B, a portion of the SiGe film 11 having a relatively high Ge concentration is etched. However, the SiGe film 11 may be etched in its entirety. Instead of the SiGe film 12 having a relatively low Ge concentration, a Si film may be used.

Figure 9A:
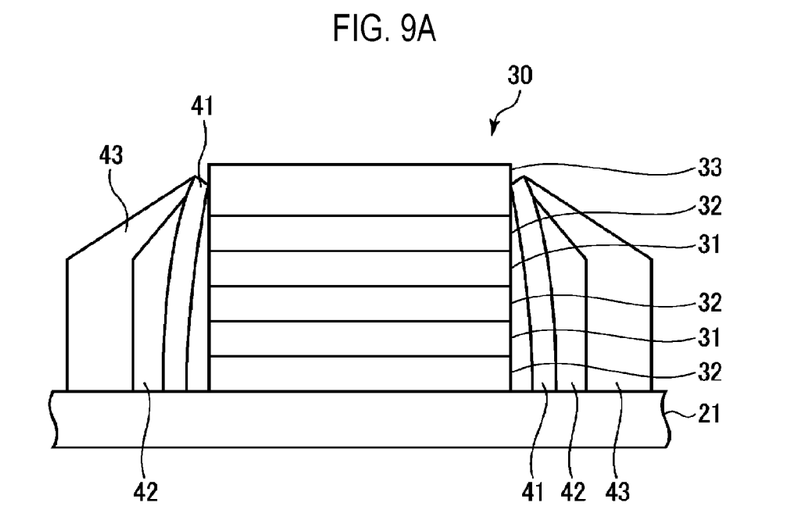
FIG. 9A is a schematic sectional view showing a second example of a structure of a workpiece to which the first and second embodiments are applied, wherein a state before etching is shown.
Figure 9B:
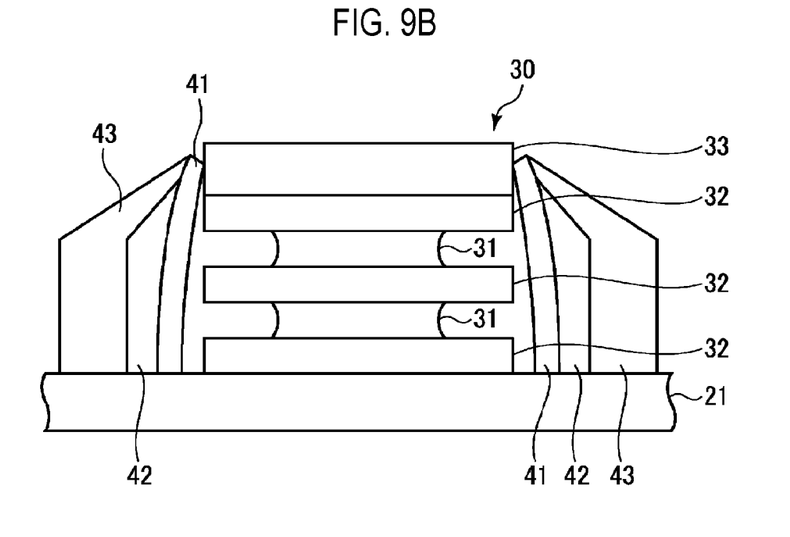
FIG. 9B is a schematic sectional view showing a second example of a structure of a workpiece to which the first and second embodiments are applied, wherein a state after etching is shown.

FIGS. 9A and 9B are diagrams showing a second example of the structure of the workpiece.

In this example, as shown in FIG. 9A, a stacked structure of a SiGe film 31 having a relatively high Ge concentration (e.g., a Ge concentration of 30 at %) as a first film to be etched and a Si film 32 is formed on a semiconductor substrate 21 such as a Si substrate or the like via an insulating film (not shown). On both sides of the stacked structure 30, a SiGe film 42 having a relatively low Ge concentration (e.g., a Ge concentration of 10 at %) 42 functioning as a protective layer and corresponding to a second film and a SiGe film 43 having a relatively high Ge concentration (e.g., a Ge concentration of 30 at %) provided outside the SiGe film 42 are formed in portions corresponding to a source and drain of the semiconductor substrate 21 via an insulating film 41 such as a low-k film or the like. In the stacked structure 30, the Si film 32 and the SiGe film 31 having a relatively high Ge concentration are sequentially stacked on the semiconductor substrate 21. The uppermost layer is the Si film 32. An etching mask 33 composed of, for example, an $SiO_2$ film is formed on the uppermost Si film 32.

In this state, the workpiece is kept at a predetermined temperature. A fluorine-containing gas such as a $ClF_3$ gas or the like is supplied as in the first example of the first embodiment, or the supply of the fluorine-containing gas and the purging are repeated as in the first example of the second embodiment, whereby the SiGe film 31 having a relatively high Ge concentration is etched to obtain, for example, the state of FIG. 9B. At this time, the SiGe film 42 having a relatively low Ge concentration is hardly etched and functions as a protective layer. Thus, the SiGe film 43 having a relatively high Ge concentration (e.g., a Ge concentration of 30 at %) is not etched.

In the above-described two structural examples, the SiGe film having a relatively high Ge concentration and the SiGe film (or the Si film) having a relatively low Ge concentration are inverted in the case of the second examples of the first embodiment and the second embodiment.

<Processing System>

Next, an example of a processing system provided with an etching apparatus used for implementing the first embodiment and the second embodiment will be described.

Figure 10:
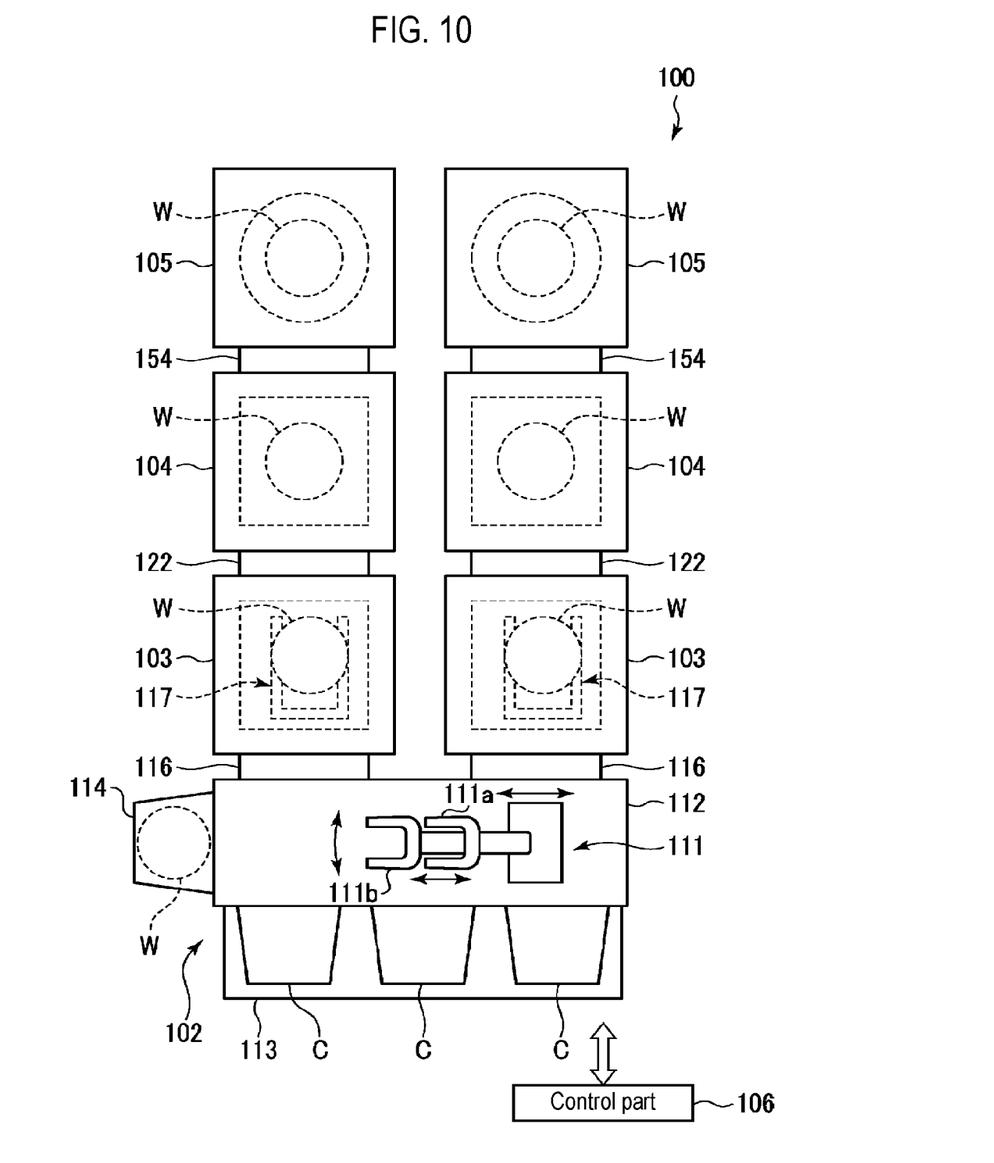
FIG. 10 is a schematic configuration diagram showing an example of a processing system mounted with an etching apparatus used for implementing the first embodiment and the second embodiment.

FIG. 10 is a schematic configuration diagram showing an example of a processing system. A processing system 100 includes a loading/unloading part 102 configured to load and unload a wafer W, which is a workpiece having the structure shown in the aforementioned structural example, two load lock chambers 103 provided adjacent to the loading/unloading part 102, two heat treatment apparatuses 104 provided adjacent to the respective load lock chambers 103 and configured to perform heat treatment on the wafer W, two etching apparatuses 105 located adjacent to the respective heat treatment apparatuses 104 and configured to etch the wafer W, and a control part 106.

The loading/unloading part 102 includes a transfer chamber 112 in which a first wafer transfer mechanism 111 for transferring the wafer W is provided. The first wafer transfer mechanism 111 includes two transfer arms 111a and 111b for holding the wafer W in a substantially horizontal posture. On one side of the transfer chamber 112 in the longitudinal direction, a mounting stand 113 is provided. For example, three carriers C such as FOUPs for accommodating a plurality of wafers W are configured to be connected to the mounting stand 113. In addition, an alignment chamber 114 for aligning the wafer W is provided adjacent to the transfer chamber 112.

In the loading/unloading part 102, the wafer W is held by the transfer arm 111a or 111b. The wafer W is linearly moved in a substantially horizontal plane and is moved up and down with the driving of the first wafer transfer mechanism 111, whereby the wafer W is transferred to a desired position. Then, the transfer arms 111a and 111b are respectively moved forward and backward with respect to the carriers C on the mounting stand 113, the alignment chamber 114 and the load lock chambers 103, whereby the wafers W are loaded and unloaded.

Each of the load lock chambers 103 is coupled to the transfer chamber 112 in a state in which a gate valve 116 is interposed between each load lock chamber 103 and the transfer chamber 112. In each of the load lock chambers 103, a second wafer transfer mechanism 117 for transferring the wafer W is provided. In addition, the load lock chamber 103 is configured to be evacuable to a predetermined degree of vacuum.

The second wafer transfer mechanism 117 has a multi joint arm structure and includes a pick that holds the wafer W in a substantially horizontal posture. In the second wafer transfer mechanism 117, the pick is located inside the load lock chamber 103 with the multi-joint arm kept in a contracted state. As the multi-joint arm is extended, the pick reaches the heat treatment apparatus 104. As the multi-joint arm is further extended, the pick can reach the etching apparatus 105. Therefore, the wafer W can be transferred between the load lock chamber 103, the heat treatment apparatus 104 and the etching apparatus 105.

The control part 106 is typically composed of a computer and includes a main control part having a CPU for controlling each constituent part of the processing system 100, an input device (keyboard, mouse, etc.), an output device (printer, etc.), a display device (display, etc.) and a memory device (storage medium). The main control part of the control part 106 controls the processing system 100 to execute a predetermined operation, for example, based on a processing recipe stored in the storage medium built in the memory device or the storage medium set in the memory device.

In the processing system 100 configured as above, the plurality of wafers W having the above structure formed thereon is accommodated in the carrier C and transferred to the processing system 100. In the processing system 100, the gate valve 116 located at the atmospheric side is opened. In this state, one sheet of wafer W is transferred from the carrier C of the loading/unloading part 102 to the load lock chamber 103 by one of the transfer arms 111a and 111b of the first wafer transfer mechanism 111, and is delivered to the pick of the second wafer transfer mechanism 117 in the load lock chamber 103.

Thereafter, the atmospheric-side gate valve 116 is closed and the interior of the load lock chamber 103 is evacuated. Then, a gate valve 154 is opened and the pick is extended up to the etching apparatus 105 to transfer the wafer W to the etching apparatus 105.

Subsequently, the pick is returned to the load lock chamber 103 and the gate valve 154 is closed. For example, an etching process is performed on the SiGe film having a relatively high Ge concentration in the etching apparatus 105 according to the above-described etching method.

After the etching process is completed, a gate valve 122 and the gate valve 154 are opened, the wafer W subjected to the etching process is transferred to the heat treatment apparatus 104 by the pick of the second wafer transfer mechanism 117. In the heat treatment apparatus 104, an etching residue or the like is removed by heating.

After the heat treatment in the heat treatment apparatus 104 is completed, the wafer W is returned to the carrier C by one of the transfer arms 111a and 111b of the first wafer transfer mechanism 111. In this way, the processing of one sheet of wafer W is completed.

In a case where it is unnecessary to remove the etching residue or the like, the heat treatment apparatus 104 may be omitted. In this case, the wafer W subjected to the etching process may be moved toward the load lock chamber 103 by the pick of the second wafer transfer mechanism 117 and may be returned to the carrier C by one of the transfer arms 111a and 111b of the first wafer transfer mechanism 111.

<Etching Apparatus>

Next, an example of the etching apparatus 105 for carrying out the etching method of the first examples of the first and second embodiments will be described in detail.

Figure 11:
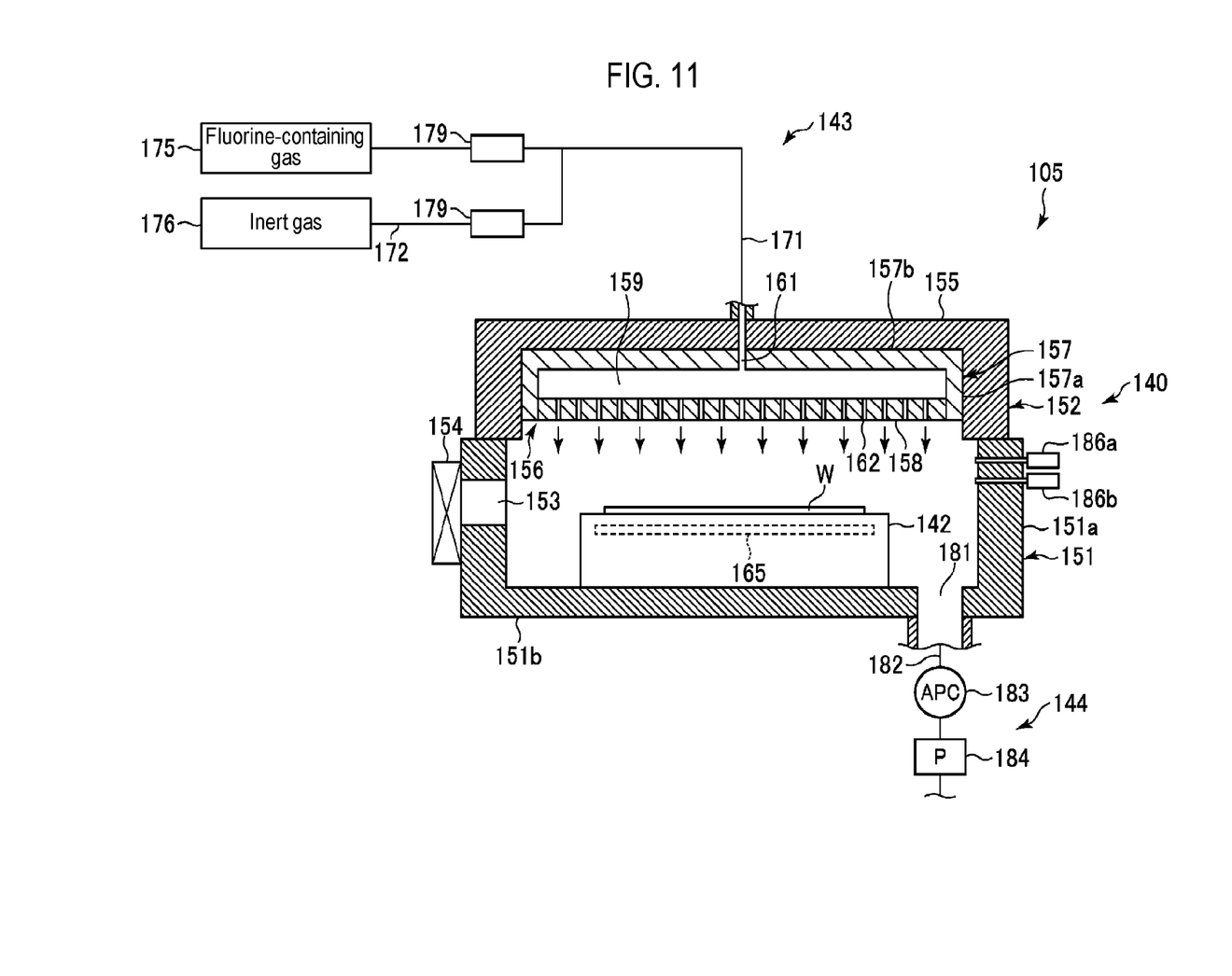
FIG. 11 is a sectional diagram showing an example of an etching apparatus for carrying out an etching method of a first example of the first and second embodiments.

FIG. 11 is a sectional view showing an example of the etching apparatus 105. As shown in FIG. 11, the etching apparatus 105 includes a chamber 140 having a hermetically sealed structure and serving as a process container that defines a process space. Inside the chamber 140, there is provided a mounting table 142 for mounting a wafer W thereon in a substantially horizontal posture. In addition, the etching apparatus 105 includes a gas supply mechanism 143 for supplying an etching gas to the chamber 140, and an exhaust mechanism 144 for exhausting the interior of the chamber 140.

The chamber 140 includes a chamber main body 151 and a lid 152. The chamber main body 151 includes a substantially cylindrical sidewall portion 151a and a bottom portion 151b. An upper portion of the chamber main body 151 is opened. The opening is closed by the lid 152. The sidewall portion 151a and the lid 152 are hermetically sealed by a seal member (not shown), thereby securing air-tight the interior of the chamber 140.

The lid 152 includes a lid member 155 constituting an outer portion of the lid 152 and a shower head 156 fitted inside the lid member 155 and provided so as to face the mounting table 142. The shower head 156 includes a main body 157 having a cylindrical sidewall 157a and an upper wall 157b, and a shower plate 158 provided at the bottom of the main body 157. A space 159 is formed between the main body 157 and the shower plate 158.

A gas introduction path 161 is formed in the lid member 155 and the upper wall 157b of the main body 157 so as to extend to the space 159. A fluorine-containing gas supply pipe 171 of a gas supply mechanism 143 described later is connected to the gas introduction path 16.

A plurality of gas discharge holes 162 is formed in the shower plate 158. A gas introduced into the space 159 via the gas supply pipe 171 and the gas introduction path 161 is discharged from the gas discharge holes 162 into an internal space of the chamber 140.

A loading/unloading port 153 through which the wafer W is loaded into and unloaded from the heat treatment apparatus 104, is formed in the sidewall portion 151a. The loading/unloading port 153 is configured to be opened and closed by the gate valve 154.

The mounting table 142 has a substantially circular shape in plan view and is fixed to the bottom portion 151b of the chamber 140. A temperature adjuster 165 for adjusting a temperature of the mounting table 142 is provided inside the mounting table 142. The temperature adjuster 165 is provided with a conduit through which, for example, a temperature adjusting medium (e.g., water) circulates. Heat exchange is performed with the temperature adjusting medium flowing through the conduit, whereby the temperature of the mounting table 142 is adjusted so that the temperature of the wafer W mounted on the mounting table 142 is controlled.

The gas supply mechanism 143 includes a fluorine-containing gas supply source 175 for supplying a fluorine-containing gas such as a $ClF_3$ gas or the like and an inert gas supply source 176 for supplying an inert gas such as an Ar gas or the like. The fluorine-containing gas supply source 175 and the inert gas supply source 176 are connected to one end of the fluorine-containing gas supply pipe 171 and one end of an inert gas supply pipe 172, respectively. A flow rate controller 179 for opening and closing a respective pipe and controlling a flow rate is provided in each of the fluorine-containing gas supply pipe 171 and the inert gas supply pipe 172. The flow rate controller 179 includes, for example, an opening/closing valve and a mass flow controller. The other end of the fluorine-containing gas supply pipe 171 is connected to the gas introduction path 161 as described above. The other end of the inert gas supply pipe 172 is connected to the fluorine-containing gas supply pipe 171.

Therefore, the fluorine-containing gas is supplied from the fluorine-containing gas supply source 175 into the shower head 156 via the fluorine-containing gas supply pipe 171. The inert gas is supplied from the inert gas supply source 176 into the shower head 156 via the inert gas supply pipe 172 and the fluorine-containing gas supply pipe 171. These gases are discharged from the gas discharge holes 162 of the shower head 156 toward the wafer W received in the chamber 140.

Of these gases, the fluorine-containing gas is used as a reaction gas, and the inert gas is used as a dilution gas and a purge gas. By supplying the fluorine-containing gas alone or supplying a mixed gas of the fluorine-containing gas and the inert gas, it is possible to obtain a desired etching performance.

The exhaust mechanism 144 includes an exhaust pipe 182 connected to an exhaust port 181 formed in the bottom portion 151b of the chamber 140. The exhaust mechanism 144 further includes an automatic pressure control valve (APC valve) 183 for controlling an internal pressure of the chamber 140 and a vacuum pump 184 for exhausting the interior of the chamber 140, which are provided in the exhaust pipe 182.

Two capacitance manometers 186a and 186b used as pressure gauges for measuring the internal pressure of the chamber 140 are provided in the sidewall of the chamber 140 so as to be inserted into the chamber 140. The capacitance manometer 186a is used to measure a high pressure, and the capacitance manometer 186b is used to measure a low pressure. A temperature sensor (not shown) for detecting a temperature of the wafer W is provided in the vicinity of the wafer W mounted on the mounting table 142.

In the etching apparatus 105 configured as above, the wafer W having the above-described structure formed thereon is loaded into the chamber 140 and mounted on the mounting table 142. Then, the internal pressure of the chamber 140 is set to be in a range of 10 to 1,000 mTorr (1.33 to 133 Pa), for example 120 mTorr (16 Pa). By means of the temperature adjuster 165 of the mounting table 142, the wafer W is heated to 100 degrees C. or higher, specifically 100 to 125 degrees C., more specifically 120 degrees C.

In the case where etching is performed according to the first example of the first embodiment, the fluorine-containing gas such as $ClF_3$ gas or the like is supplied into the chamber 140 at a flow rate of, for example, 1 to 100 sccm, to etch the SiGe film having a relatively high Ge concentration. As a result, it is possible to etch the SiGe film having a relatively high Ge concentration at a high selectivity with respect to the SiGe film having a relatively low Ge concentration or a Si film without substantially etching the SiGe film having a relatively low Ge concentration or the Si film. At this time, an inert gas such as Ar or the like may be supplied together with the fluorine-containing gas at a flow rate of, for example, 100 to 1,000 sccm. After the etching is completed, the interior of the chamber 140 is purged with the inert gas, and the wafer W is unloaded from the chamber 140.

In the case where etching is performed according to the first example of the second embodiment, an etching step of supplying a fluorine-containing gas such as $ClF_3$ or the like into the chamber 140 at a flow rate of, for example, 1 to 100 sccm, to etch the SiGe film having a relatively high Ge concentration, and a purging step of purging a process space inside the chamber 140 by evacuation or a combination of evacuation and inert gas supply are repeated to etch the SiGe film having a relatively high Ge concentration by a desired etching amount. As a result, it is possible to etch the SiGe film having a relatively high Ge concentration at a high selectivity with respect to the SiGe film having a relatively low Ge concentration or a Si film without substantially etching the SiGe film having a relatively low Ge concentration or the Si film. At this time, in the etching step, the inert gas such as an Ar gas or the like may be supplied together with the fluorine-containing gas at a flow rate of, for example, 100 to 1,000 sccm. After the etching is completed, the interior of the chamber 140 is purged with the inert gas, and the wafer W is unloaded from the chamber 140.

Figure 12:
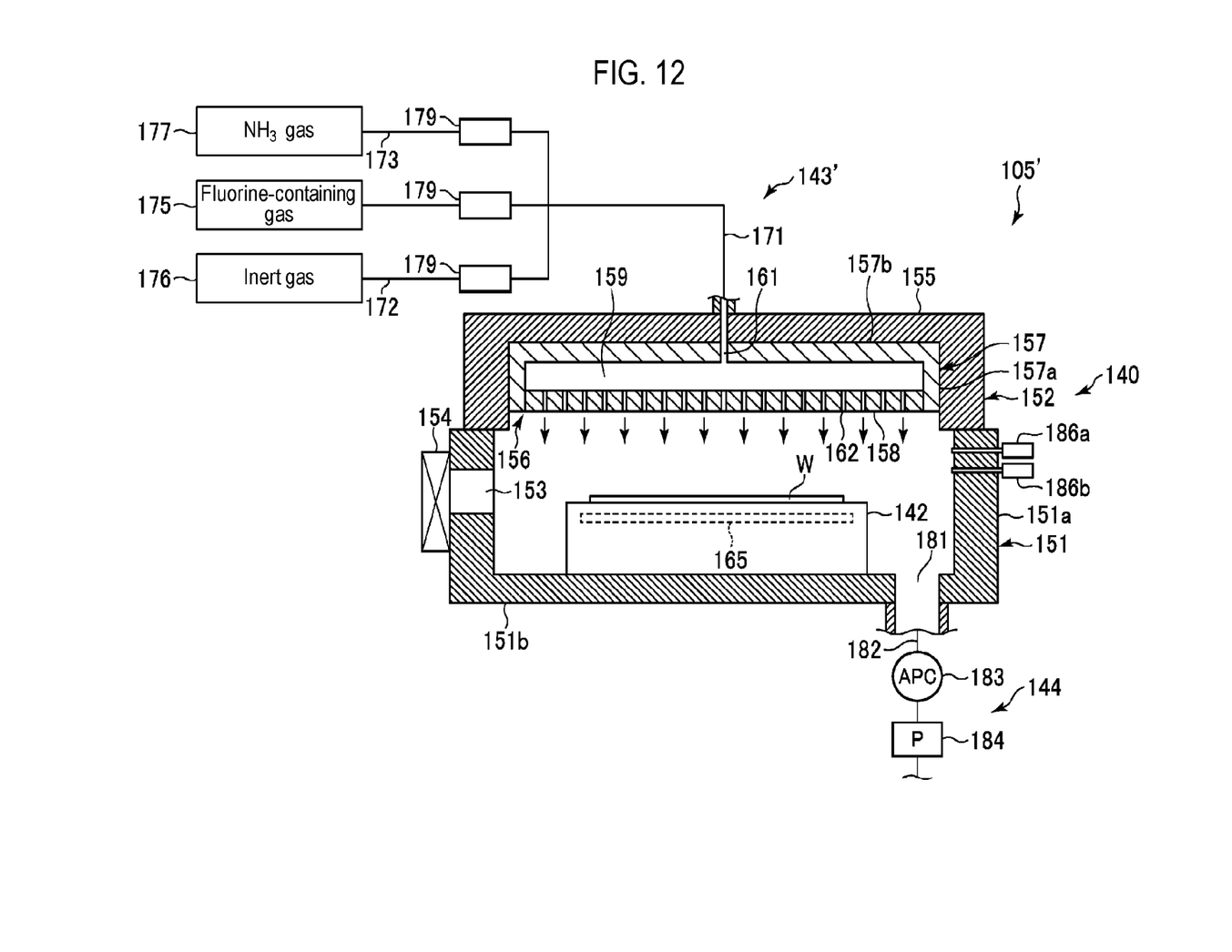
FIG. 12 is a diagram showing an example of an etching apparatus for carrying out an etching method of a second example of the first and second embodiments.

In the case where etching is performed according to the second examples of the first and second embodiments, the etching is performed by an etching apparatus 105' shown in FIG. 12. The etching apparatus 105' includes a gas supply mechanism 143' which is provided with the fluorine-containing gas supply source 175, the inert gas supply source 176 and an $NH_3$ gas supply source 177, instead of the gas supply mechanism 143 of the etching apparatus 105 shown in FIGS. 8A and 8B. One end of an $NH_3$ gas supply pipe 173 is connected to the $NH_3$ gas supply source 177. The other end of the $NH_3$ gas supply pipe 173 is connected to the fluorine-containing gas supply pipe 171. Similarly to the fluorine-containing gas supply pipe 171 and the inert gas supply pipe 172, the flow rate controller 179 is provided in the $NH_3$ gas supply pipe 173.

In the etching apparatus 105' configured as above, for the wafer W having a structure in which the SiGe film having a relatively high Ge concentration and the SiGe film having a relatively low Ge concentration (or the Si film) are inverted from the two structural examples shown in FIGS. 5 and 6, the SiGe film having a relatively low Ge concentration (or the Si film) can be etched at a high selectivity with respect to the SiGe film having a relatively high Ge concentration using the fluorine-containing gas and the $NH_3$ gas.

Other Applications

Although the embodiments have been described above, it should be understood that the embodiments disclosed herein are exemplary in all respects and not restrictive. The above embodiments may be omitted, replaced or modified in various forms without departing from the scope of the appended claims and the gist thereof.

For example, the structural example of the workpiece in the above embodiments is nothing more than one example. Any workpiece is applicable as long as the workpiece includes a first SiGe-based material and a second SiGe-based material (containing 0% of Ge) having different Ge concentrations. In addition, the configurations of the above-described processing system and the individual apparatuses are nothing more than one example. The etching method of the present disclosure can be implemented by a system or apparatus of various configurations.

According to the present disclosure in some embodiments, it is possible to etch one of a first SiGe-based material and a second SiGe-based material at a high selectivity without substantially etching the other.

What is claimed is:

1. An etching method, comprising:
   supplying an etching gas to a workpiece including a first SiGe-based material having a Ge concentration of 20 to 50 at % and a second SiGe-based material having a Ge concentration of 5 to 15 at %; and
   selectively etching one of the first SiGe-based material and the second SiGe-based material with respect to the other for a time during which one of the first SiGe-based material and the second SiGe-based material is etched while the other is not etched,
   wherein temperature during the etching is 100 degrees C. or greater.

2. The method of claim 1, wherein the temperature during the etching falls within a range of 100 to 125 degrees C.

3. The method of claim 1, wherein the etching gas includes a fluorine-containing gas.

4. The method of claim 3, wherein the fluorine-containing gas is at least one selected from a group consisting of a $ClF_3$ gas, a $F_2$ gas and an IFS gas.

5. The method of claim 3, wherein the first SiGe-based material is a first film, and the second SiGe-based material is a second film,
   the method comprising:
   selectively etching the first film with respect to the second film using the fluorine-containing gas as the etching gas.

6. The method of claim 5, wherein the workpiece is configured by stacking the first film and the second film one above another on a substrate at least once.

7. The method of claim 5, wherein the workpiece includes a structure portion having the first film as an etching target, an SiGe film not to be etched which is provided outside the structure portion and has a Ge concentration equivalent to the Ge concentration of the first film, and the second film provided as a protective layer of the SiGe film not to be etched between the structure portion and the SiGe film not to be etched, which are formed on a substrate.

8. The method of claim 3, wherein the first SiGe-based material is a first film, and the second SiGe-based material is a second film,
   the method comprising:
   selectively etching the second film with respect to the first film using the fluorine-containing gas and an $NH_3$ gas as the etching gas.

9. The method of claim 1, wherein a pressure during the etching falls within a range of 1.33 to 133 Pa.

10. The method of claim 5, wherein the first film has a Ge concentration of 25 to 35 at %.

11. An etching method, comprising:
    repeating, a multiple number of times, an etching process of supplying an etching gas to a workpiece including a first SiGe-based material having a Ge concentration of 20 to 50 at % and a second SiGe-based material having a Ge concentration of 5 to 15 at % for an etching time during which one of the first SiGe-based material and the second SiGe-based material is etched while the other is not etched, and a purging process of purging a process space, to selectively etch one of the first SiGe-based material and the second SiGe-based material with respect to the other,
    wherein temperature during the etching is 100 degrees C. or greater.

12. The method of claim 11, wherein a period of time required for the etching process is 1 to 10 seconds per process; and a period of time required for the purging process is 5 to 30 seconds per process.

* * * * *

UNITED STATES PATENT AND TRADEMARK OFFICE
CERTIFICATE OF CORRECTION

PATENT NO. : 11,011,383 B2
APPLICATION NO. : 16/252918
DATED : May 18, 2021
INVENTOR(S) : Yasuo Asada, Takehiko Orii and Nobuhiro Takahashi It is certified that error appears in the above-identified patent and that said Letters Patent is hereby corrected as shown below:

In the Claims

Claim 4, Column 15, Line 38, please delete the phrase "a F2 gas and an IFS gas" and replace with "a F2 gas and an IF7 gas".

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*